(12) United States Patent
Lu et al.

(10) Patent No.: US 8,288,063 B2
(45) Date of Patent: Oct. 16, 2012

(54) DEFENSE SYSTEM IN ADVANCED PROCESS CONTROL

(75) Inventors: Shin-Rung Lu, Chu-Pei (TW); Chih Ming Hong, Hsin-Chu (TW); Yen-Di Tsen, Chung-Ho (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 237 days.

(21) Appl. No.: 12/844,507

(22) Filed: Jul. 27, 2010

(65) Prior Publication Data

US 2012/0028174 A1    Feb. 2, 2012

(51) Int. Cl.
*G03F 9/00*    (2006.01)

(52) U.S. Cl. ............................................ 430/22; 430/30

(58) Field of Classification Search ................. 430/22, 430/30

See application file for complete search history.

(56) References Cited

U.S. PATENT DOCUMENTS 6,815,232 B2    11/2004    Jones et al.
7,842,442 B2 *  11/2010    Seltmann et al. ............... 430/22

* cited by examiner

*Primary Examiner* — Christopher Young
(74) *Attorney, Agent, or Firm* — Slater & Matsil, L.L.P.

(57) ABSTRACT

A method includes performing a lithography process on a wafer to form a patterned photo resist, and measuring the wafer to determine an overlay error of the patterned photo resist. A high/low specification is determined using the overlay error. An overlay process value setting is generated and compared with the high/low specification to determine whether the overlay process value setting is within a range defined by the high/low specification.

19 Claims, 4 Drawing Sheets

DEFENSE SYSTEM IN ADVANCED PROCESS CONTROL

TECHNICAL FIELD

This disclosure relates generally to integrated circuit manufacturing processes, and more particularly to lithography processes, and even more particularly to defense systems used in advanced process control (APC) of the lithograph processes.

BACKGROUND

Integrated circuits are formed on wafers. Each wafer includes many patterned layers such as well regions, a polysilicon layer, metal layers, and the like. The alignment of the layers is referred to as an overlay control, which involves measuring the misalignment between two successive layers on the surface of a wafer. Generally, the minimization of misalignment errors is important to ensure that the multiple layers of the integrated circuit devices are connected. As advances in technology facilitate smaller critical dimensions for integrated circuit devices, the need for the reduction in misalignment errors increases significantly.

Generally, a set of photolithography steps is performed on a lot of wafers using a semiconductor manufacturing tool commonly referred to as an exposure tool, such as a stepper or a scanner. The manufacturing tool communicates with a manufacturing framework or a network of processing modules. The manufacturing tool is generally connected to an equipment interface. The equipment interface is further connected to a machine interface to which the stepper is connected, thereby facilitating communications between the stepper and the manufacturing framework. The machine interface may generally be a part of an advanced process control (APC) system. The APC system initiates a control script, which can be a software program that automatically retrieves the data needed to execute a manufacturing process.

A metrology tool may be used to measure the overlay errors in exposed wafers, and to feedback the overlay errors to the lithography process of subsequent wafers. However, abnormal cases may occur. For example, an error may occur to the metrology tool that is used to measure the overlay errors. This type of errors may be adversely propagated to the formation of subsequent wafers, causing the requirement of re-performing in the lithograph process of subsequent wafers or even the scrap of the subsequent wafers.

SUMMARY

In accordance with one aspect, a method includes performing a lithography process on a wafer to form a patterned photo resist, and measuring the wafer to determine an overlay error of the patterned photo resist. A high/low specification is determined using the overlay error. An overlay process value setting is generated and compared with the high/low specification to determine whether the overlay process value setting is within a range defined by the high/low specification.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figure 1:
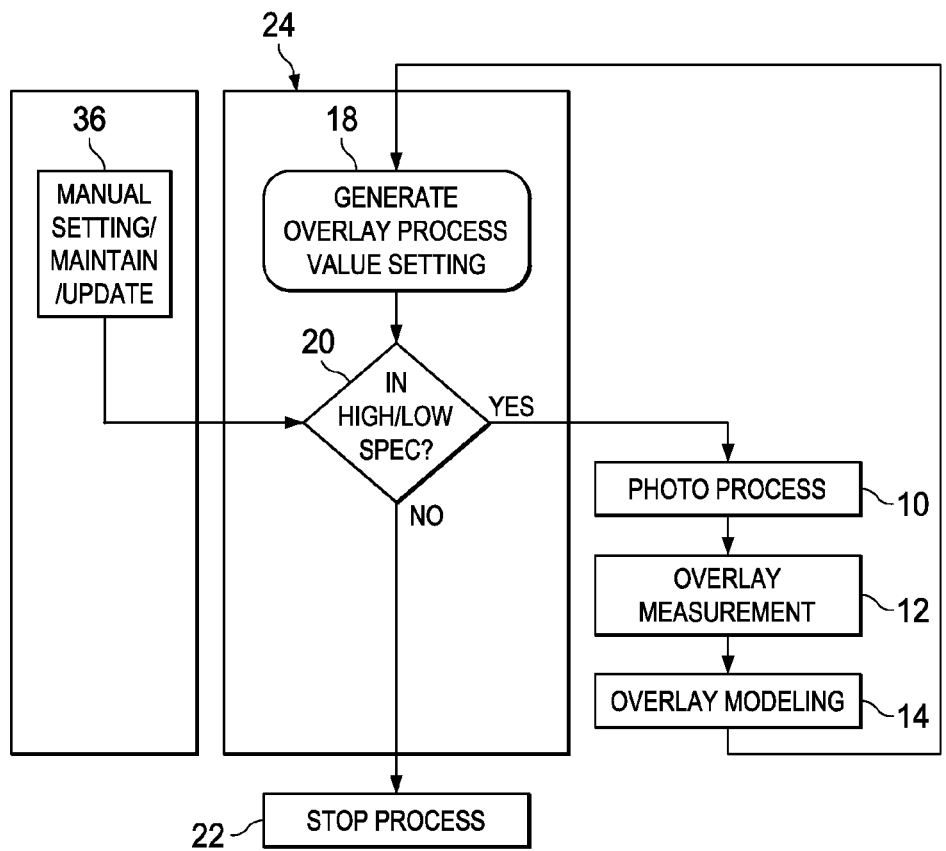
FIG. 1 illustrates a flow of a lithograph process using an advance process control (APC) system, wherein a high/low spec is set manually.
Figure 5:
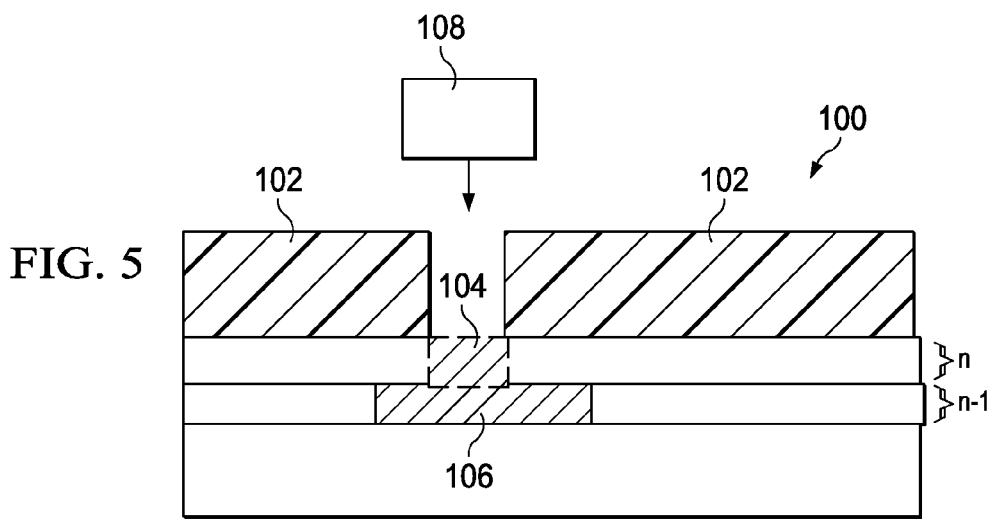
FIG. 5 illustrates a cross-section view of a wafer involved in an overlay control.

FIG. 1 illustrates a process flow for performing a lithograph process on wafer 100 (not shown in FIG. 1, please refer to FIG. 5), wherein advanced process control (APC) system 24 is used. First, wafer 100, which includes layer n−1, is provided. Layers n and n−1 may represent any layers that may be formed on wafers, including, but not limited to, well regions, gate electrodes, metal layers, and the like. Photo resist 102 is then formed over layer n (or layer n−1 if layer n has not been formed), and is patterned, with the patterns in photo resist 102 vertically aligned to features 106 in layer n−1. For example, photo resist 102 may be the pattern of the dielectric material in layer n, in which damascene metal line 104 is to be formed. Although photo resist 102 is intended to be accurately aligned to features 106, overlay errors may occur, and the patterns in photo resist 102 may misalign with features 106. The misalignment is referred to as overlay errors. After the formation and the patterning of photo resist 102 (step 10 in FIG. 1), the raw overlay (error) data between photo resist 102 and layer n−1 is measured (step 12), for example, using a metrology tool (as schematically illustrated as 108 in FIG. 5). The measurement may be performed to a plurality of selected points on wafer 100. Since the raw overlay data cannot be used directly by APC system 24 (FIG. 1), they need to be fitted into an overlay model (step 14) to calculate the overlay errors, which overlay errors may be used by APC system 24 directly.

When calculating overlay errors from the raw overlay data using the overlay model, the raw data obtained by the metrology tool are translated into translation errors, magnification errors, rotation errors, and/or the like. The translation errors represent the shift (toward +x/−x and +y/−y directions in the surface plane of wafer 100 as in FIG. 5) of the patterns in photo resist 102 (FIG. 5) from the intended positions (with relative to layer n−1, for example). The magnification errors represent whether the patterns in photo resist 102 are greater or smaller than intended. The rotation errors represent whether the patterns in photo resist 102 are rotated clockwise or counter clockwise from the intended position.

Steps 10, 12, and 14 may be repeated for a plurality of wafers. For example, in each group of wafers, which group may include 25 wafers, a sample wafer is measured to determine the overlay errors. After a plurality of (such as five or ten) sample wafers are selected and measured after the respective lithography processes are performed, the overlay errors obtained from the sample wafers may be used to calculate an overlay process value setting (step 18). The overlay process value setting includes parameters for directing APC system 24 to control a stepper (not shown) to expose photo resists 102 (FIG. 5) for subsequent wafers. The overlay process value setting is optimized to minimize the overlay errors in the subsequent wafers, and may include a translation setting, a rotation setting, a magnification setting, and the like. For example, the translation setting may be used to direct the exposure of subsequent wafers to shift in +x (or −x) direction for a certain distance, so that the exposed patterns of photo resist 102 (FIG. 5) may be accurately aligned to the patterns in underlying layer n−1. Similarly, the rotation setting may be used to direct the exposure of subsequent wafers to rotate clockwise or counter clockwise for a certain angle.

It is realized that abnormal situations may arise to cause the raw overlay data and the calculated overlay errors to deviate from actual values in the respective wafers. For example, the metrology tool may malfunction, causing the resulting raw overlay data to deviate from actual values. Further, the sample points on the sample wafers may be selected improperly, which also causes the resulting overlay errors not to reflect the actual values. The calculated overlay process value setting is accordingly wrong. If the lithography processes are formed on subsequent wafers using the calculated overlay process value setting that is based on wrong overlay errors, either the photo resists formed on the subsequent wafers need to be reworked after the problem is found, or the subsequent wafers need to be scrapped.

To prevent the wrong overlay process value setting to be used in the lithography of subsequent wafers, a high/low specification (spec) is utilized to detect whether the abnormal cases have occurred or not. The high/low spec may include a plurality of high/low spec values, each corresponding to one of translation errors, magnification errors, rotation errors, and the like. The high/low spec may include a high spec value and a low spec value for each of overlay inter and intra terms modeling data including, but are not limited to, the translation high/low spec, the magnification high/low spec, and the rotation high/low spec, etc. For example, the high translation spec value indicates the maximum allowable overlay process value setting for shifting toward +x (or +y) direction, and the low translation spec value indicates the maximum allowable overlay process value setting for shifting toward −x (or −y) direction. Similarly, the high/low spec may include a rotation high spec value and a rotation low spec value, with the high rotation spec value indicating the maximum allowable overlay process value setting for rotating clockwise, and the low rotation spec value indicating the maximum allowable overlay process value setting for rotating counter clockwise.

Referring to step 20, the overlay process value setting is compared with the respective high/low spec to determine whether the overlay process value setting is within the respective high/low spec. It is realized that the high/low spec may be calculated from a first plurality of wafers, and the overlay process value setting may be calculated from a second plurality of wafers that are processed (undergoing steps 10, 12, and 14) after the first plurality of wafers. In other words, the high/low spec are first calculated from some wafers, and is then used to determine the correctness of the overlay process value setting that is obtained from later wafers. The translation setting is compared with the translation high/low spec. The magnification setting is compared with the magnification high/low spec. The rotation setting is compared with the rotation high/low spec. If any of the overlay process value setting is not in the respective high/low spec, the lithography process is stopped (step 22), until the reasons are found and problem fixed. If all of the overlay process value setting is in the respective high/low specs, then the process is continued to perform lithography process on a subsequent wafer using the overlay process value setting. Steps 18 and 20 are functions of APC system 24, and may be performed automatically by APC system 24.

The high spec value cannot be set too high and the low spec value cannot be set too low. Otherwise, the abnormal cases cannot be caught, and the purpose of setting the high/low spec is defeated. On the other hand, the high spec value cannot be set too low and the low spec value cannot be set too high. Otherwise, normal processes may be wrongfully determined as abnormal cases. The high/low spec thus needs to be optimized. In conventional processes, however, the high/low spec is determined, maintained, and updated manually (step 36 in FIG. 1) by lab personnel based on experience. Accordingly, it is difficult to find and maintain an optimal high/low spec.

Figure 2:
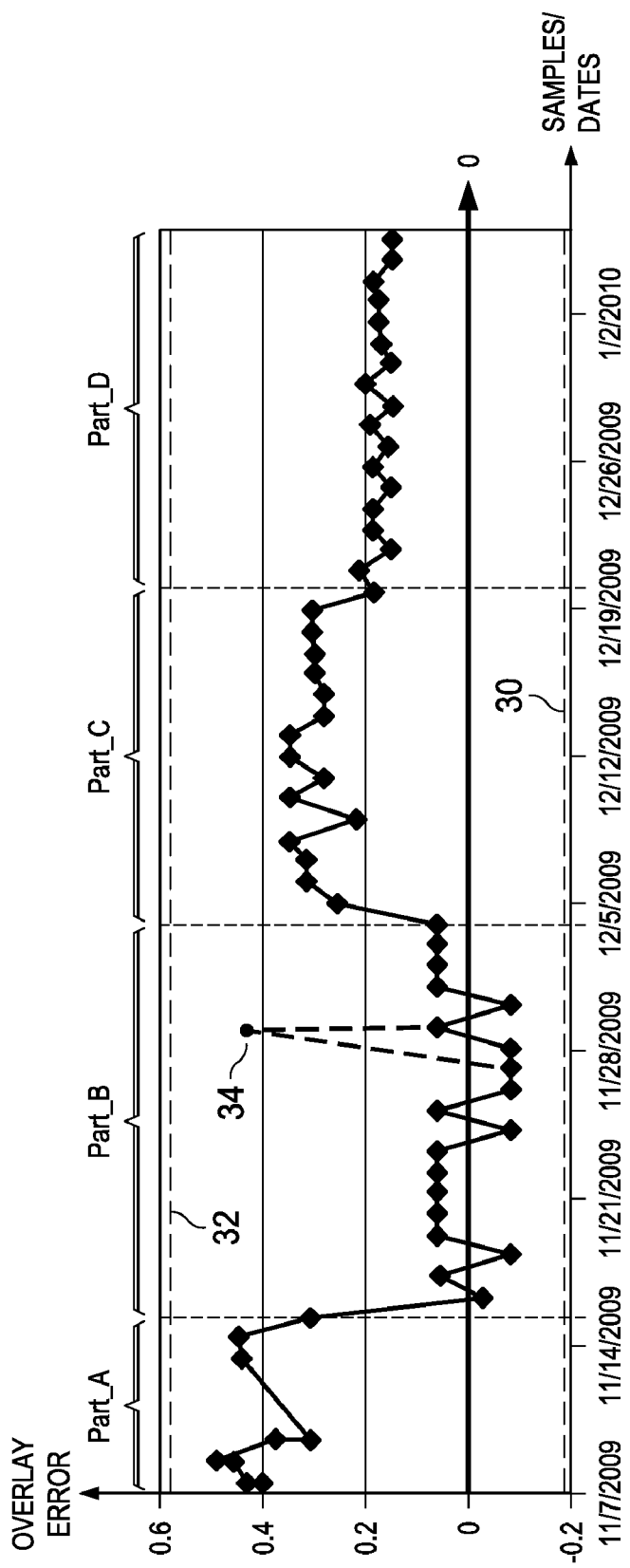
FIG. 2 illustrates a relationship between different groups of samples and overlay errors obtained from the samples, wherein a high/low spec is set manually.

FIG. 2 illustrates a graph showing sample overlay errors obtained from sample wafers. The X-axis indicates the sample wafers and the dates the sample wafers were measured, and the Y-axis represents the overlay errors obtained from the sample wafers. The high spec value is shown as line 32, and the low spec value is shown as line 30. There are four groups of sample wafers measured on different dates, including groups part_A, part_B, part_C, and part_D. It is observed that the overlay errors of these four groups are significantly different from each other, although the overlay errors in a same group are similar. From FIG. 2, it is also observed that to fit all four groups, high spec value 32 has to be very high, and low spec value 30 has to be very low. However, this may cause some abnormal case not being caught. For example, if an overlay error in a sample wafer in group part_B is at point 34, it will be determined as in the high/low spec. However, overlay error 34 significantly exceeds the normal range of overlay errors of group part_B, and hence may belong to an abnormal case.

Due to the limitation of the manual setting and manual updating of the high/low spec, existing high/low spec is set, updated, and maintained only according to technology generations (for example, 40 nm or 45 nm) and layer identifications (for example, gate electrode layer, metal layers M1 and M2, or the like). However, experiment results have revealed that the optimized high/low spec is also affected, in addition to the technology generations and layer identifications, by various other factors such as the product design of the wafer, the mask version, and the like. Accordingly, the optimized high/low spec also needs to take these factors into consideration.

Figure 3:
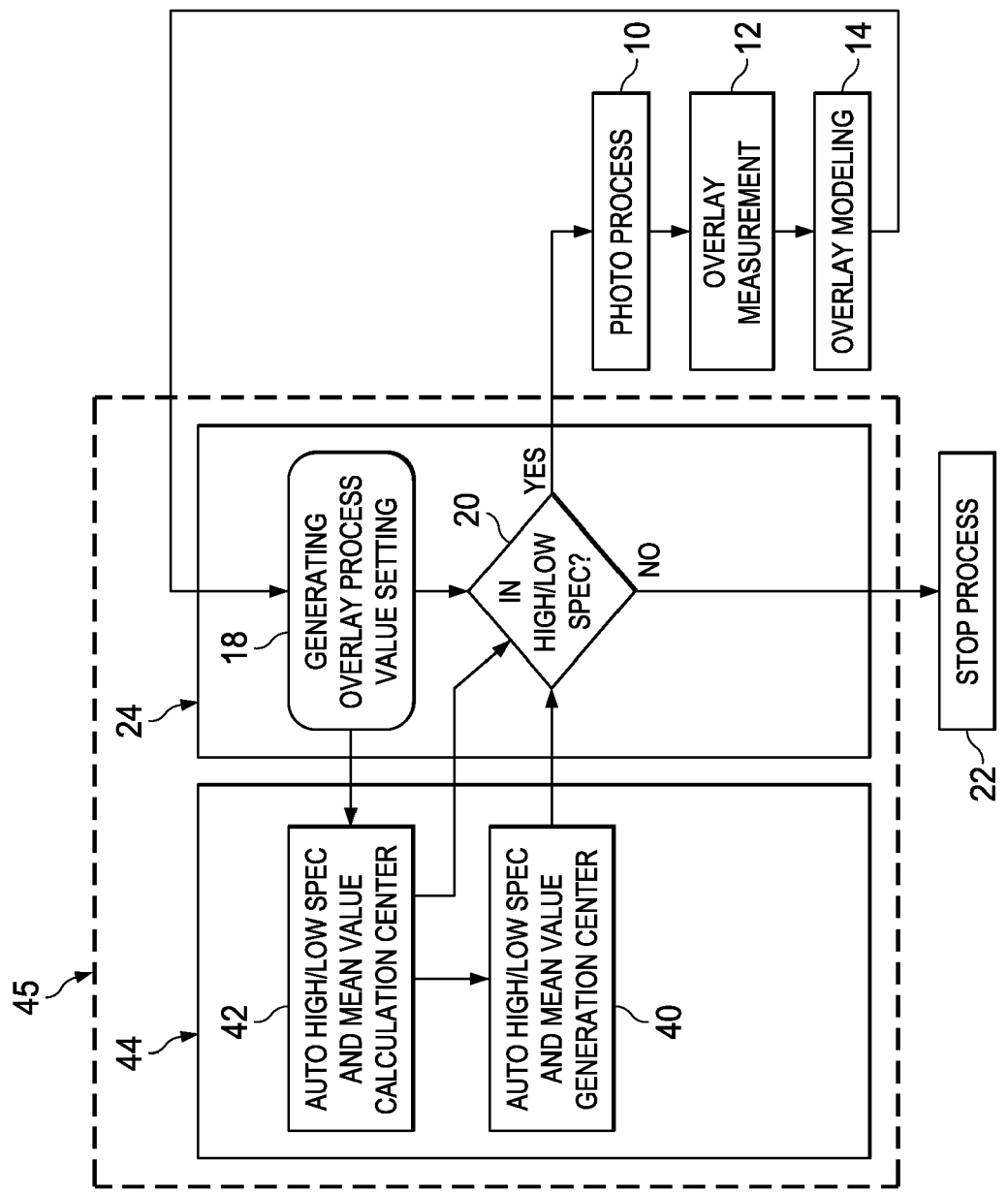
FIG. 3 illustrates a flow of a lithograph process using an APC system, wherein a high/low spec is automatically generated and automatically updated.

FIG. 3 illustrates an embodiment wherein the high/low spec is generated and updated automatically. Steps 10 through 22 may be essentially the same as in FIG. 1, and are not discussed herein. Referring to block 40, an initial high/low spec is automatically generated by an automatic high/low spec and mean value generation center, which may include software and a computer running the software. Step 40 is performed as a part of the function of defense system 44, which automatically generates and updates the high/low spec values as a defense against wrongfully overlay process value setting. Defense system 44 and APC system 24 in combination may be referred to as defense and APC system 45. In an initial process before any lithography process is formed on a group of wafers, high/low spec generation center 40 generates the initial high/low spec, which may be based on empirical values previously obtained from similar product groups, and based on the experience of lab personnel. The initial high/low spec is then used to control wrongful overlay process value setting, as illustrated in steps 20 and 22.

Process is then continued to automatically update the high/low spec. After the calculation of overlay errors through overlay modeling (step 14), the overlay errors are stored in APC system 24, and may be retrieved from APC system 24 for the calculation of an updated high/low spec (step 42) and the mean value, which task is performed by an auto high/low spec & mean value calculation center. In an exemplary embodiment, an average overlay errors is calculated automatically without human intervention. For example, the sample wafers may have an average translation error (in x direction) of 2 nm. From the average overlay error, a pre-determined times (which may be between 3 and 4, for example, with the value 4 used in the following examples) of standard deviation (sigma) may be added to the average overlay error to determine the high spec value, and the pre-determined times of the standard deviation may be subtracted from the average overlay error to determine the low spec value. For example, assuming the standard deviation is −0.6 nm, then the high spec value will be −2+4*0.6=4.4 nm, while the low spec value may be 2−4*0.6=−0.4 nm. Similarly, for the translation in the Y direction, the magnification, and/or rotation, the respective high/low spec values may also be determined using essentially the same method.

The calculated high/low spec value(s) may be set (step 20) and used to determine whether the subsequent overlay process value setting (step 18) is within the high/low spec. The loop including steps 10 through 22 and step 42 may be continued, and the high/low spec is automatically updated. Further, the updated high/low spec may be saved, for example, into a file that is located on a physical storage media (such as a disk), so that in the future, it may be used as the initial value for similar groups of wafers.

Figure 4:
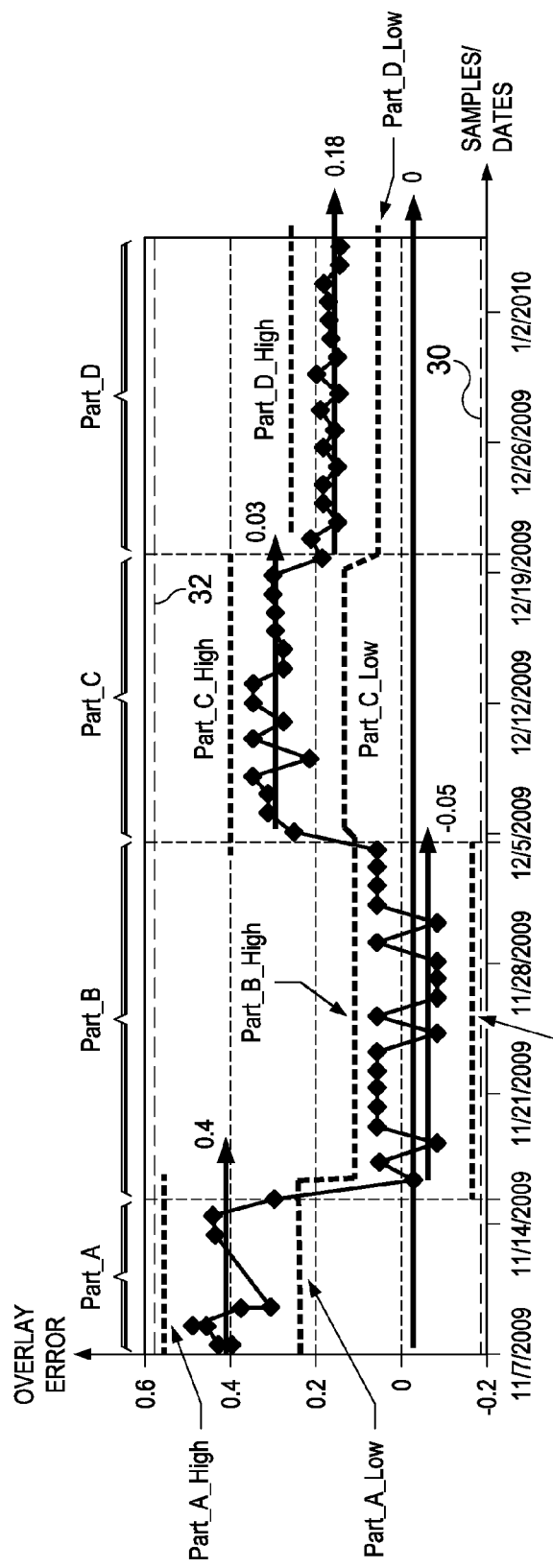
FIG. 4 illustrates a relationship between different groups of samples and overlay errors obtained from the samples, wherein a high/low spec is automatically generated and automatically updated.

FIG. 4 illustrates a result obtained from wafers when the embodiment as shown in FIG. 3 is used. The x-axis indicates sample wafers measured during multiple dates, and the y-axis indicates overlay errors. It is observed that during the lithography process performed on wafer group part_A, the high spec value is automatically set to part_A_high, the low spec value is automatically set to part_A_low. For other groups, part_B, part_C, and part_D, the respective high/low specs are also generated, as marked in FIG. 4, with each of the high/low spec denoted using the respective group name followed by the notation "_high" or "_low." The high spec values for different groups are different from each other, and are optimized for the respective groups. The low spec values for different groups are different from each other, and are optimized for the respective groups. It is observed that the range between high spec value part_A_high and part_A_low is much smaller than the range between manually set high/low spec values 32 and 30. Therefore, it is more likely to catch any abnormal case using the automatically generated high/low spec. In addition, the wrongfully catching of the abnormal cases is also minimized since high/low spec values part_A_high and part_A_low are customized according to the overlay errors obtained from sample wafer group part_A. The same conclusion may be drawn for other groups.

By using the embodiments, the reliability and stability in the overlay APC is improved, resulting in reduced re-work rates and scrap rates of wafers. Further, experiment results further revealed that the cycle time may be improved over 90 percent due to the reduction of wrongful catching of overlay process value setting errors and the reduction of re-work rates.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an integrated circuit, the method comprising:
   performing a lithography process on a wafer to form a patterned photo resist;
   measuring the wafer to determine an overlay error of the patterned photo resist;
   determining a high/low specification using the overlay error;
   generating an overlay process value setting; and
   comparing the overlay process value setting with the high/low specification to determine whether the overlay process value setting is within a range defined by the high/low specification.

2. The method of claim 1, wherein the step of determining the high/low specification is performed by an automatic high/low spec generation center and an advanced process control (APC) system.

3. The method of claim 1, wherein the high/low specification comprises a high spec value and a low spec value, and wherein the step of determining the high/low specification comprises:
   calculating an average overlay error by averaging the overlay error and additional overlay errors obtained from a plurality of additional wafers;
   adding a pre-determined value to the average overlay error to calculate the high spec value; and
   subtracting the pre-determined value from the average overlay error to calculate the low spec value.

4. The method of claim 3, wherein the pre-determined value is between about three times and about four times a standard deviation of the overlay error and the additional overlay errors.

5. The method of claim 1 further comprising repeating steps from the step of performing the lithography process to the step of comparing the overlay process value setting with the high/low specification, wherein the high/low specification is repeatedly updated.

6. The method of claim 1 further comprising, before the step of performing the lithography process on the wafer, setting an initial high/low specification, wherein the initial high/low specification is determined based on a technology generation for forming the integrated circuit, a product design of the integrated circuit, and a factor selected from the group consisting essentially of a layer identification and a mask version associated with the lithography process.

7. The method of claim 1, wherein the patterned photo resist comprises a pattern for a layer selected from the group consisting essentially of well regions, a gate electrode layer, and a metal layer.

8. The method of claim 1, wherein the step of measuring the wafer to determine the overlay error comprises:
   measuring the wafer using a metrology tool to obtain a raw overlay error; and
   calculating the overlay error from the raw overlay error by fitting the raw overlay error into an overlay model.

9. The method of claim 1, wherein the high/low specification comprises a high translation spec value and a low translation spec value.

10. The method of claim 1, wherein the high/low specification comprises a high magnification spec value and a low magnification spec value.

11. The method of claim 1, wherein the high/low specification comprises a high rotation spec value and a low rotation spec value.

12. A method of forming an integrated circuit, the method comprising:
   providing a plurality of wafers;
   performing a lithography process on the plurality of wafers to form a patterned photo resist on each of the plurality of wafers;
   measuring the plurality of wafers to determine overlay errors of the patterned photo resists;
   calculating an average overlay error from the overlay errors;
   calculating a standard deviation from the overlay errors; and
   determining a high/low specification comprising:
      calculating a high spec value by adding a multiple times of standard deviation onto the average overlay error; and
      calculating a low spec value by subtracting the multiple times of standard deviation from the average overlay error.

13. The method of claim 12 further comprising:
   generating an overlay process value setting; and
   comparing the overlay process value setting with the high/low specification to determine whether the overlay process value setting is within a range between the high spec value and the low spec value.

14. The method of claim 13 further comprising, if the overlay process value setting is not within the range between the high spec value and the low spec value, re-performing the lithography process on the plurality of wafers.

15. The method of claim 13 further comprising, if the overlay process value setting is within the range between the high spec value and the low spec value, applying the overlay process value setting to the lithography process on a subsequent wafer.

16. The method of claim 12, wherein the step of determining the high/low specification is performed automatically by an automatic high/low spec center and an advanced process control (APC) system.

17. The method of claim 12, wherein the multiple times of the standard deviation is between about three times and about four times the standard deviation.

18. The method of claim 12 further comprising repeating steps from the step of providing the plurality of wafers to the step of determining the high/low specification to repeatedly update the high/low specification.

19. The method of claim 12, wherein the patterned photo resist comprises a pattern for a layer selected from the group consisting essentially of well regions, a gate electrode layer, and a metal layer.

* * * * *